(12) United States Patent
Li et al.

(10) Patent No.: US 6,831,017 B1
(45) Date of Patent: Dec. 14, 2004

(54) CATALYST PATTERNING FOR NANOWIRE DEVICES

(75) Inventors: Jun Li, Sunnyvale, CA (US); Alan M. Cassell, San Jose, CA (US); Jie Han, Cupertino, CA (US)

(73) Assignee: Integrated Nanosystems, Inc., Los Gatos, CA (US)

( * ) Notice: Subject to any disclaimer, the term of this patent is extended or adjusted under 35 U.S.C. 154(b) by 293 days.

(21) Appl. No.: 10/117,866

(22) Filed: Apr. 5, 2002

(51) Int. Cl.$^7$ .................. H01L 21/311; H01L 21/20; H01L 21/36
(52) U.S. Cl. .................. 438/694; 438/486
(58) Field of Search ............... 438/694, 691, 438/1, 105, 142, 607, 486

(56) References Cited

U.S. PATENT DOCUMENTS

| | | | |
|---|---|---|---|
| 5,866,434 | A | 2/1999 | Massey et al. |
| 6,146,227 | A | 11/2000 | Mancevski |
| 6,159,742 | A | 12/2000 | Lieber et al. |
| 6,187,823 | B1 | 2/2001 | Haddon et al. |
| 6,283,812 | B1 | 9/2001 | Jin et al. |
| 6,339,281 | B2 | 1/2002 | Lee et al. |
| 2002/0055010 | A1 * | 5/2002 | Gao et al. .............. 428/607 |

FOREIGN PATENT DOCUMENTS

| | | |
|---|---|---|
| WO | WO 00/09443 | 7/1999 |
| WO | WO 01/03208 | 1/2001 |

OTHER PUBLICATIONS

NanoLab, "Patterned Nanotube Array," http://www.nano-lab.com/image2.html.

Bahr et al., "Functionalization of Carbon Nanotubes by Electrochemical Reduction of Aryl Diazonium Salts: A Bucky Paper Electrode," *J. Amer. Chem. Soc.* 123(27): 6536–6542 (2001).

Balavoine et al., "Helical Crystallization of Proteins on Carbon Nanotubes: A First Step towards the Development of New Biosensors," *Angew. Chem. Int. Ed.* 38(13/14): 1912–1915 (1999).

Baughman et al., "Carbon Nanotube Actuators," *Science* 284: 1340–1344 (1999).

Bingel, "Cyclopropanierung von Fullerenen," *Chem. Ber.* 126(8): 1957–1959 (1993).

Braasch et al., "Locked Nucleic Acid (LNA) : Fine–tuning the Recognition of DNA and RNA," *Chem. Biol.* 8(1): 1–7 (2001).

Campbell et al., "Electrochemistry Using Single Carbon Nanotubes," *J. Amer. Chem. Soc.* 121: 3779–3780 (1999).

Cassell et al., "Combinatorial Optimization of Heterogeneous Catalysts Used in the Growth of Carbon Nanotubes," *Langmuir* 2001: 260–264.

Chen et al., "Heterogeneous Single Walled Carbon Nanotube Catalyst Discovery and Optimization," Submitted to *Chenistry of Materials* as an Article (Mar. 1, 2002).

Chen et al., "Solution Properties of Single–Walled Carbon Nanotubes," *Science* 282: 95–98 (1998).

Chen et al., "Noncovalent Sidewall Functionalization of Single–Walled Carbon Nanotubes for Protein Immobilization," *J. Am. Chem. Soc.* 123(16): 3838–3839 (2001).

(List continued on next page.)

Primary Examiner—Craig A. Thompson
(74) Attorney, Agent, or Firm—G. Victor Treyz (57) ABSTRACT

Nanowire devices may be provided that are based on carbon nanotubes or single-crystal semiconductor nanowires. The nanowire devices may be formed on a substrate. Catalyst sites may be formed on the substrate. The catalyst sites may be formed using lithography, thin metal layers that form individual catalyst sites when heated, collapsible porous catalyst-filled microscopic spheres, microscopic spheres that serve as masks for catalyst deposition, electrochemical deposition techniques, and catalyst inks. Nanowires may be grown from the catalyst sites.

18 Claims, 11 Drawing Sheets

OTHER PUBLICATIONS

Collins et al., "Extreme Oxygen Sensitivity of Electronic Properties of Carbon Nanotubes," *Science* 287: 1801–1804 (2000).

Cui et al., "Nanowire Nanosensors for Highly Sensitive and Selective Detection of Biological and Chemical Species," *Science* 293: 1289–1292 (2001).

Dai et al., "Nanotubes as Nanoprobes in Scanning Probe Microscopy," *Nature* 384: 147–149 (1996).

Doyle et al., "Recent Advances in Asymmetric Catalytic Metal Carbene Tranformations," *Chem. Rev.* 98(2): 911–935 (1998).

Franklin et al., "Patterned Growth of Single–Walled Carbon Nanotubes on Full 4–inch Wafers," *Applied Physics Letters* 79(27): 4571–4573 (2001).

Gillmor et al., "Hydrophillic/Hydrophobic Patterned Surfaces as Templates for DNA Arrays," *Langmuir* 16: 7223–7228 (2000).

Iijima, Sumio, "Helical Microtubules of Graphitic Carbon," *Nature* 354: 56–58 (1991).

Illescas et al., "Stereoselective Synthesis of C60–Based Cyclopropane Amino Acids," *J. Org. Chem.* 65(19): 6246–6248 (2000).

Isaacs et al., "176. Structures and Chemistry of Methanofullerenes: A Versatile Route into N–[(Methanofullerene)carbonyl]–Substituted Amino Acids," *Helvetica Chimica Acta.* 76(7): 2454–2464 (1993).

Kong et al., "Nanotube Molecular Wires as Chemical Sensors," *Science* 287: 622–625 (2000).

Liu et al., "Fullerene Pipes," *Science* 280: 1253–1256 (1998).

Lyer et al., "Modified Oligonucleotides—Synthesis, Properties, and Applications," *Curr. Opin. Mol. Ther.* 1(3): 344–358 (1999).

Martin, "Nanomaterials: A Membrane–Based Snythetic Approach," *Science* 266: 1961–1966 (1994).

Menon et al., "Fabrication and Evaluation of Nanoelectrode Ensembles," *Anal. Chem.* 67: 1920–1928 (1995).

Nielsen, "Peptide Nucleic Acid: A Versatile Tool in Genetic Diagnostics and Molecular Biology," *Curr. Opin. Biotechnol.* 12(1): 16–20 (2001).

Nugent et al., "Fast Electron Transfer Kinetics on Multi-walled Carbon Nanotube Microbundle Electrodes," *Nano Letters* 1(2): 87–91 (2001).

Odom et al., "Atomic Structure and Electronic Properties of Single–Walled Carbon Nanotubes," *Nature* 391: 62–64 (1998).

Rouhi, Maureen, "Chemical Sensing with Nanotubes," *News of the Week* 78(5): 7–8 (Jan. 31, 2000).

Sano et al., "Ring Closure of Carbon Nanotubes," *Science* 293: 1299–1301 (2001).

Strother et al., "Synthesis and Characterization of DNA–Modified Silicon (111) Surfaces," *J. Am. Chem. Soc.* 122: 1205–1209 (2000).

Tans et al., "Room–Temperature Transistor Based on a Single Carbon Nanotube," *Nature* 393: 49–52 (1998).

Ugo et al., "Ion–Exchange Voltammetry at Polymer Film–Coated Nanoelectrode Ensembles," *Anal. Chem.* 68: 4160–4165 (1996).

Verma et al., "Modified Oligonucleotides: Synthesis and Strategy for Users," *Annu. Rev. Biochem.* 67: 99–134 (1998).

Wei et al., "Organized Assembly of Carbon Nanotubes: Cunning Refinements Help to Customize the Architecture of Nanotube Structures," *Nature* 416: pp. 495–496 (Apr. 4, 2002).

Wildoer et al., "Electronic Structure of Atomically Resolved Carbon Nanotubes," *Nature* 391: 59–60 (1998).

Wong et al., "Covalentely–Functionalized Single–Walled Carbon Nanotube Probe Tips for Chemical Force Microscopy," *J. Am. Chem. Soc.* 120: 8557–8558 (1998).

Wong et al., "Covalently Functionalized Nanotubes as Nanometre–sized Probes in Chemistry and Biology," *Nature* 394: 52–55 (1998).

Wong et al., "Carbon Nanotube Tips: High–Resolution Probes for Imaging Biological Systems," *J. Am. Chem. Soc.* 120: 603–604 (1998).

Yenilmez et al., "Wafer Scale Production of Carbon Nanotube Scanning Probe Tips for Atomic Force Microscopy," *Applied Physics Letters* 80(12): 2225–2227 (Mar. 25, 2002).

* cited by examiner

CATALYST PATTERNING FOR NANOWIRE DEVICES

STATEMENT OF GOVERNMENT SUPPORT

This invention was made in the course of U.S. contract No. NAS2-99092 awarded by NASA. The U.S. government has certain rights in the invention.

BACKGROUND OF THE INVENTION

This invention relates to nanowires and more particularly, to ways in which to pattern catalyst sites from which nanowires are grown.

Nanowires are of interest for forming chemical or biological sensors, field emitters for flat panel displays, and other devices. Nanowires such as carbon nanotubes may be metallic in nature. Single-crystal semiconductor nanowires may also be grown. A typical nanowire may have a diameter on the order of 10–100 nm and a length of 0.5–5 $\mu$m. Applications and potential applications for devices based on nanowire structures include sensors and field emitters for flat panel displays.

The growth of nanowires such as single and multiple wall carbon nanotubes and semiconductor nanowires has been demonstrated experimentally. Nanowire growth may be initiated using catalysts deposited on the surface of a substrate. Improved techniques for patterning such catalysts are needed.

It is therefore an object of the present invention to provide improved ways in which to pattern nanowire catalysts for nanowire devices.

SUMMARY OF THE INVENTION

Nanowire catalyst patterning methods and nanowire structures fabricated using patterned catalyst layers are provided. Nanowires may be formed on substrates such as silicon, quartz, glass, or other suitable substrate materials. An optional electrode layer may be formed on the substrate. The electrode layer may, for example, be formed of titanium, gold, or platinum or other metals or conductive materials. The electrode layer may be patterned. For example, photolithographic techniques may be used to pattern the electrode layer into an array of pads.

A catalyst layer may be used to seed the growth of nanowires on the pads or other portions of substrate surface. Catalyst sites may be distributed in a random pattern or may be purposefully distributed in a known pattern. A known pattern of "dots" of catalyst may, for example, be used to form a regular array of nanowires with a desired spacing between nanowires and desired wire diameters.

Catalyst sites may be patterned using a number of suitable techniques. For example, e-beam lithography, a metal deposition technique such as evaporation, and the lift-off process may be used to form catalyst sites. Other suitable catalyst site formation techniques that may be used include techniques based on heating deposited metal so that it collects into discrete metal areas or clumps ("metal migration"), heat-collapsible porous polymer spheres filed with metal salts, techniques in which metal is evaporated through a thin-film assembly of microscopic spheres (e.g., spheres 100 nm to 100 $\mu$m in diameter) that have been temporarily placed on the substrate surface, lithographic techniques (e.g., ultraviolet (UV) lithography such as deep UV (DUV) lithography or extreme UV (EUV) lithography, etc.), X-ray or ion beam lithography, electrochemical deposition, electroless deposition, or soft lithography (e.g., when a damp "stamp" is used to impress a pattern of catalytic "ink" on a substrate), etc.

Nanowires may be grown on the catalyst sites by known growth techniques such as thermal or plasma chemical vapor deposition techniques or other suitable nanowire growth techniques.

If desired, additional processing may be performed after the nanowires have been grown. For example, an insulating layer may be grown on the nanowires to insulate the nanowires from each other and to provide mechanical stability. The insulating layer may be planarized using chemical-mechanical polishing. The substrate on which the nanowires have been grown may be diced into individual die, each of which contains a portion of the nanowire structures formed on the substrate. The die may be packaged in suitable packages and may be interconnected with circuitry and other devices.

Further features of the invention, its nature and various advantages will be more apparent from the accompanying drawings and the following detailed description.

BRIEF DESCRIPTION OF THE DRAWINGS

FIGS. 4a–4d show how lithographic techniques may be used to pattern catalyst for nanowire devices.

FIGS. 5a–5c show how a soft lithography technique may be used to pattern catalyst for nanowire devices.

DETAILED DESCRIPTION

Figure 1A:
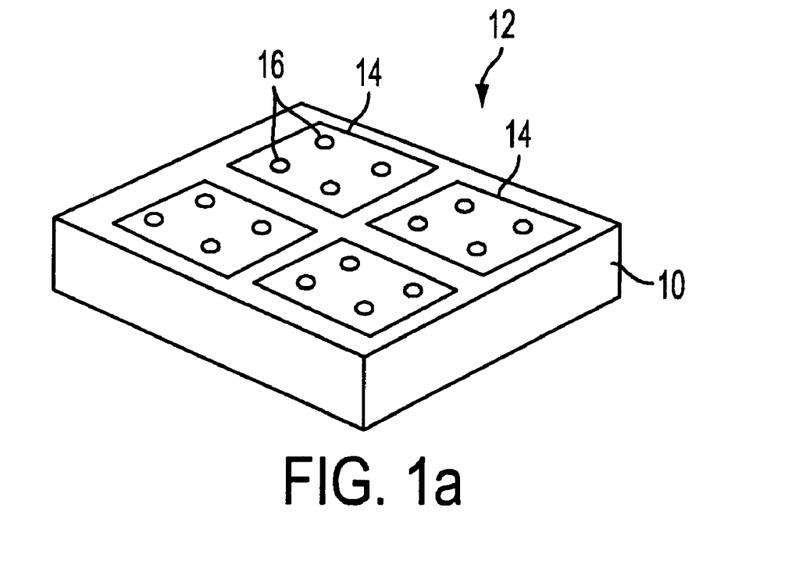
FIG. 1a is a perspective view of an illustrative nanowire device substrate having a plurality of electrode pads and nanowire catalyst sites in accordance with the present invention.

An illustrative nanowire device 12 before any nanowires have been grown is shown in FIG. 1a. Device 12 may be formed using a substrate 10. One suitable substrate material is silicon, because silicon wafers are readily available from sources supplying the semiconductor industry. A typical silicon wafer may be 10 to 25 centimeters in diameter and may have a thickness on the order of 1 mm. Other suitable substrates include other semiconductors, quartz, sapphire, and glass. These are merely illustrative examples. Any suitable substrate material may be used if desired. The device 12 of FIG. 1a may correspond to a die that has been cut from a larger wafer of substrate material during processing. In general, many devices 12 may be fabricated at the same time on a single wafer or other substrate.

One or more optional electrode pads 14 may be formed on the surface of device 12. Electrode pads 14 and interconnects formed on device 12 may help to interconnect the nanowires on the device with circuitry on other devices. Pads 14 are preferably formed of a conducting substance such as a metal. Suitable metals for pads 14 include titanium, gold, and platinum. These are merely illustrative examples of pad metals that may be used. In general, pads 14 may be formed of any suitable metal. Metal alloys may be used or layers of different metals may be used (e.g., to promote adhesion with substrate 10). Pads 14 may be omitted and substrate 10 or a single metal layer that coats all of device 12 on a large substrate may be used to electrically contact the nanowires. If desired, there may be no electrode layer formed on substrate 10.

If pads 14 are used, pads 14 may be on the order of several microns in size. For example, the lateral dimension of pads 14 (i.e., the length of a side of the square or the diameter of a circle) may be in the range of 100 nm to 1000 $\mu$m, may be in the range of 0.1 to 10 $\mu$m, may be in the range of 5 to 100 $\mu$m, may be more than 5 $\mu$m, or may be in the range of 1 to 20 $\mu$m. These are merely illustrative dimensions. The appropriate size of pads 14 will typically be determined by the desired end use of device 12. For example, if the end use of device 12 is a display device, pads 14 may be the size of the pixel size in the display. If the end use of device 12 is as a biological sensor, the appropriate size and arrangement of pads 14 may be determined by the type of biological specimen that is being detected.

As shown in FIG. 1a, one or more catalyst sites 16 may be provided on each pad 14. If one pad is used, the catalyst site or sites may be located on the single pad. If no electrode pads are used, the catalyst sites may be located directly on the substrate and any coatings that may be formed on the substrate (e.g., on oxide coatings, etc.). Typical catalysts for nanowire growth include metals such as nickel (to catalyze growth of nanowires such as carbon nanotubes) or gold (to catalyze growth of single-crystal semiconductor nanowires). If desired, some nanowires may be grown using noncatalytic nanowire growth techniques, but this is generally not preferred due to the difficulty of controlling nanowire growth parameters in the absence of catalyst.

In the example of FIG. 1a, catalyst sites 16 are shown as being spaced at fairly regular intervals. This is merely illustrative. Catalyst sites 16 may be placed wherever needed for a particular nanowire device application. An advantage of using regular (non-random) patterns such as grids or arrays is that such an approach may help to ensure that the behavior of the nanowire device is well controlled.

Nanowire diameters are typically on the order of 10 nm to 100 nm. Accordingly, catalyst sites 16 typically have lateral dimensions 20 on the order of 10 nm to 100 nm, although sites with other suitable dimensions (e.g., 5–200 nm) may be used if desired.

The density of the catalyst sites that is used depends on the desired density of nanowires to be grown. A wide range of nanowire densities may be used. For example, densities may range from $1/cm^2$ to $10^{11}/cm^2$ or more, from $10^3/cm^2$ to $10^9/cm^2$, etc. Any density of nanowires within these illustrative ranges or any other suitable density of nanowires may be produced by patterning catalyst sites 16 appropriately. There may be one catalyst site 16 and therefore one nanowire per pad 14, 1–100 sites and wires per pad, $10^2$–$10^3$ sites and wires per pad, more than $10^3$ sites and wires per pad, or $10^3$–$10^{11}$ or more sites and wires per pad if desired.

Figure 1B:
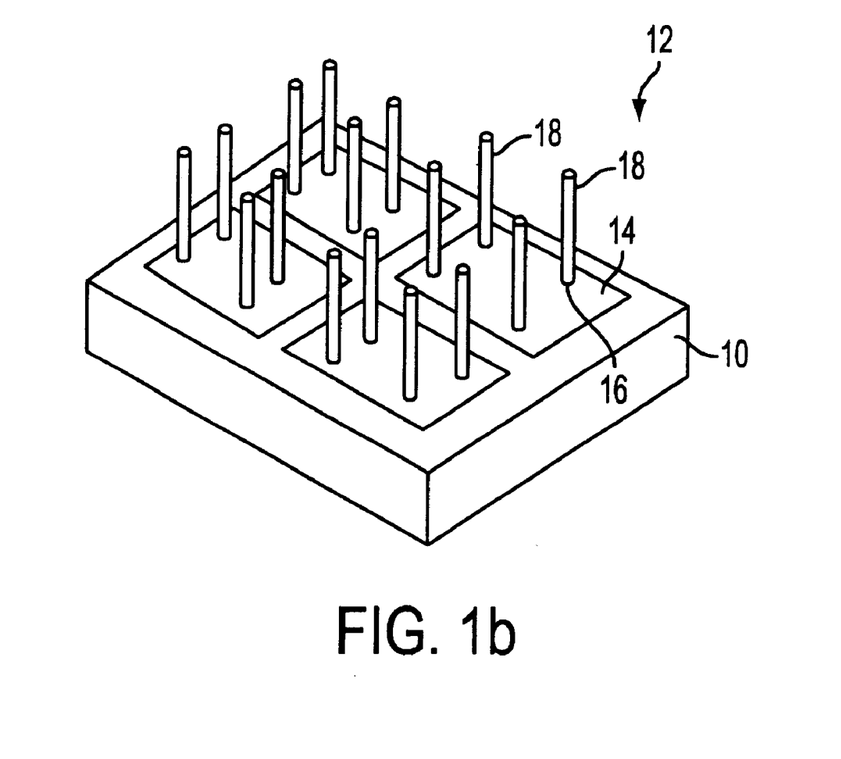
FIG. 1b is a perspective view of the device of FIG. 1a following nanowire growth showing how nanowires may be grown from the catalyst sites in accordance with the present invention.

After a suitable pattern of catalyst sites 16 has been formed on substrate 10, nanowires 18 may be grown from the sites 16, as shown in FIG. 1b. Nanowires 18 may be grown using any suitable technique such as known thermal and plasma chemical vapor deposition (CVD) techniques. The type of feedstock or precursor used during CVD nanowire growth is determined by the type of nanowire to be grown. For example, organometallic compounds or precursors such as silane or silicon tetrachloride or other vapor precursors may be used to grow single-crystal semiconductor nanowires (e.g., silicon nanowires, zinc oxide nanowires, germanium phosphate nanowires, indium phosphide nanowires, other II–VI semiconductor nanowires, III–V semiconductor nanowires, etc.) Feedstock such as methane, ethylene, acetylene, benzene, or other small hydrocarbon gasses or vapors may be used to grow single-wall and multiple-wall carbon nanotubes.

During plasma CVD growth, the inherent electric field produced by the plasma may help to vertically orient the nanowires 18 that are grown. An external electric field may also be applied to a plasma or thermal CVD growth chamber to enhance the uniformity (e.g., the verticality) of the nanowire alignment. A typical electric field strength that may be used to enhance nanowire alignment may be on the order of 700 V/cm.

Dopants such as nitrogen, oxygen, or phosphorous may be incorporated into single-crystal semiconductor nanowires by introducing dopant gasses during nanowire growth or by using any other suitable doping technique. Doped nanowires 18 may be more conductive than undoped semiconducting nanowires, which may be advantageous when the nanowires are used as conductors in finished nanowire devices.

After nanowires 18 have been grown from catalyst sites 16 as shown in FIG. 1b, it may be desirable to form additional material layers on device 12. For example, an insulating layer such as a silicon oxide layer may be deposited or grown on the nanowires to form electrical insulation and to provide mechanical stability.

Such insulating layers may be planarized by chemical-mechanical ("chem-mech") polishing, mechanical polishing, etching, or a combination of these techniques or other suitable techniques. The use of spin-on glasses may also help to planarize the substrate 10 and devices 12. After planarization, devices 12 may be separated into individual devices 12 from the wafer or other substrate 10 in which they were processed and may be packaged in individual packages for use in various applications.

Further aspects of illustrative nanowire growth and device fabrication techniques are described in the commonly-assigned concurrently-filed copending patent application entitled "Nanowire Devices and Methods of Fabrication," (Attorney Docket No. INI-1), Ser. No. 10/117,965, which is hereby incorporated by reference herein in its entirety.

The drawings of FIGS. 2a to 2e show a cross-sectional side view (not to scale) of an illustrative substrate 10 and associated nanowire structures during steps involved in fabricating an illustrative nanowire device 12.

After wafer preparation (e.g., cleaning by, for example, oxide growth and a cleaning hydrofluoric acid etch in the case of a silicon substrate) or after a layer of oxide or other suitable foundational surface layer has been grown (e.g., in the case of a silicon wafer substrate), a layer of metal may be formed on substrate 10. As an example, a layer of titanium, gold, or platinum may be evaporated onto substrate 10. Suitable adhesion metal layers may be used to enhance the adhesion of the metal to substrate 10 if desired. Metal alloys may also be deposited if desired. Although a metal layer is preferred, there may be certain applications where other suitable conductors (e.g., doped polysilicon layers) may be used in place of metal or when no layer of electrode pads are used.

Figure 2A:
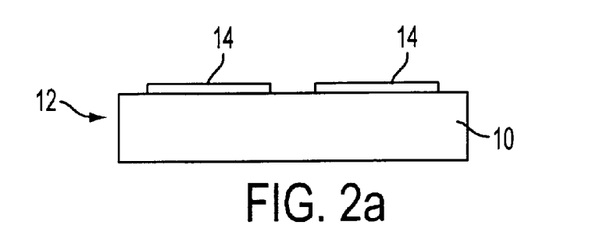
FIG. 2a is a cross-sectional side view of an illustrative nanowire device showing how electrode pads may be patterned on a substrate in accordance with the present invention.
Figure 2B:
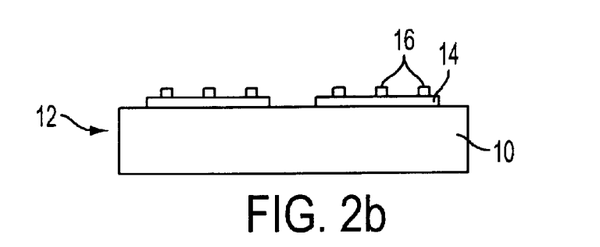
FIG. 2b is a cross-sectional side view of the illustrative nanowire device of FIG. 2a after catalyst sites have been formed on the device in accordance with the present invention.

Electrode pads 14 of the type shown in FIG. 2a may be formed by patterning the deposited metal. A shadow mask may be used during deposition to pattern the metal into pads 14 or lithography tools may be used to pattern the metal into pads 14. After patterning pads 14, patterned catalyst sites 16 may be formed on the upper surface of substrate 10 (i.e., directly on substrate 10 or any coating on substrate 10 or on pads 14), as shown in FIG. 2b.

Figure 2C:
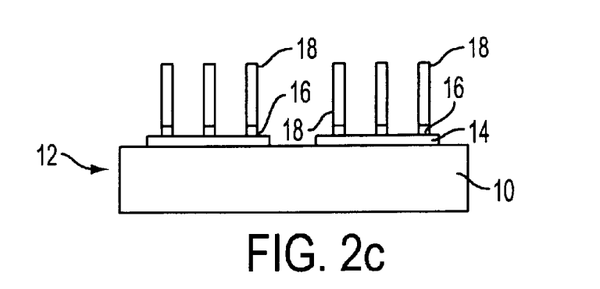
FIG. 2c is a cross-sectional side view of the illustrative nanowire device of FIG. 2b after corresponding nanowires have been grown from the catalyst sites of FIG. 2b in accordance with the present invention.

As shown in FIG. 2c, after the catalyst sites 16 have been formed, nanowires 18 may be grown on catalyst sites 16 (e.g., using thermal chemical vapor deposition, plasma-enhanced chemical vapor deposition, or any other suitable nanowire growth technique). The uniform alignment of the nanowires (e.g., all nanowires being vertical in the orientation of the example of FIG. 2c), may be enhanced during nanowire growth by use of an electric field.

Figure 2D:
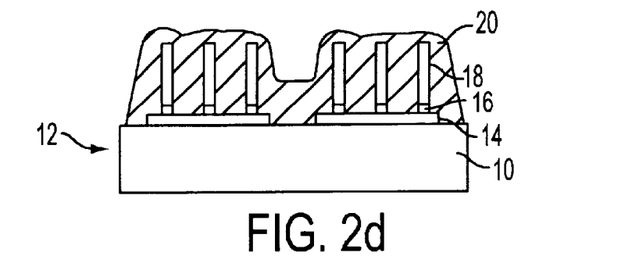
FIG. 2d is a cross-sectional side view of the illustrative nanowire device of FIG. 2c after an illustrative insulating layer has been formed on the nanowires in accordance with the present invention.

As shown in FIG. 2d, after the nanowires 34 have been grown, a layer of material 20 (e.g., an electrical insulator such as silicon oxide or a polymer or spin-on glass) may be formed on the top of the structures on substrate 10. If desired, layer 20 may be formed from a number of different materials.

Layer 20 may serve a number of purposes. For example, layer 20 may help to electrically insulate nanowires 18 from each other, which may be useful or essential for some applications. Layer 20 may also provide additional structural support for nanowires 18, which may otherwise be more susceptible to breakage or damage from the environment. Accordingly, layer 20 may also serve to seal all or at least a portion of nanowires 18 off from the environment. This type of encapsulation technique may be useful when the nanowire structures are to be used in liquids or other potentially harsh environments during operation. Layer 20 may be, for example, a tetraethylorthosilicate (TEOS) oxide layer or may be a spin-on glass layer or polymer layer that is spun onto or sprayed onto substrate 10 and subsequently cured (e.g., using an oven or hotplate).

Figure 2E:
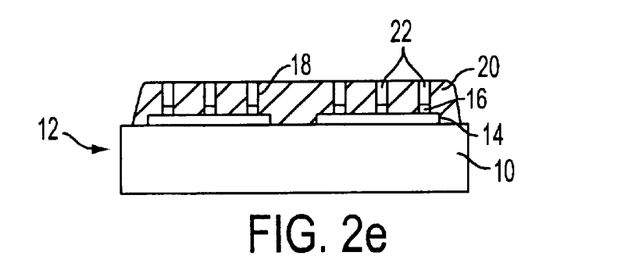
FIG. 2e is a cross-sectional side view of the illustrative nanowire device of FIG. 2d after the illustrative insulating layer has been planarized in accordance with the present invention.

After the deposition or growth process that results in layer 20 has been completed, the tips 22 of nanowires 18 may be exposed by planarizing the device 12. In the planarized substrate 10, the tips 22 of nanowires 18 are located in the same plane as the planarized surface of the insulating material of layer 20.

The use of a planarized encapsulation and insulating layer 20 is one illustrative way in which to protect nanowires 18 from damage following growth. It may be desirable to use other device fabrication techniques, depending on the application in which device 12 is used.

The catalyst patterning process described in connection with FIGS. 1a and 2b may be implemented using a number of different arrangements. In the following discussion of these arrangements, illustrative devices 12 are sometimes described that use electrode pads 14. The use of such pads 14 is, however, generally optional and may not always be desired.

Figure 3A:
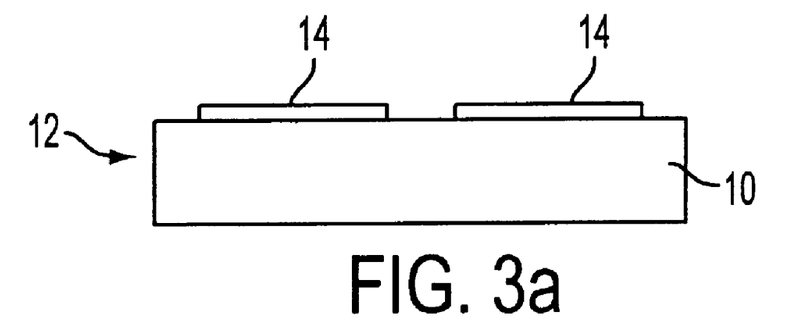
FIG. 3a is a cross-sectional side view of an illustrative nanowire device on which patterned electrode pads have been formed.
Figure 3B:
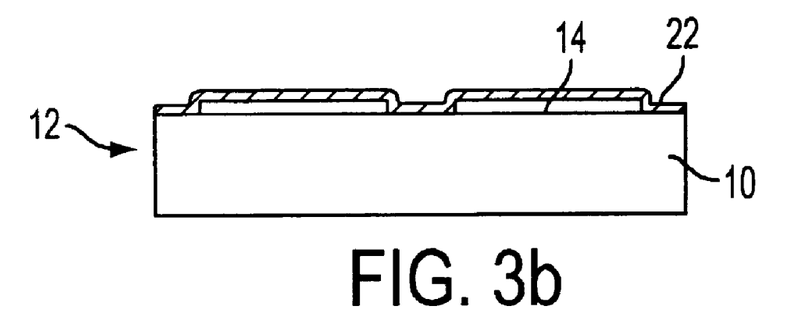
FIG. 3b is a cross-sectional side view of the illustrative nanowire device of FIG. 3a after a thin catalyst layer has been deposited in accordance with the present invention.
Figure 3C:
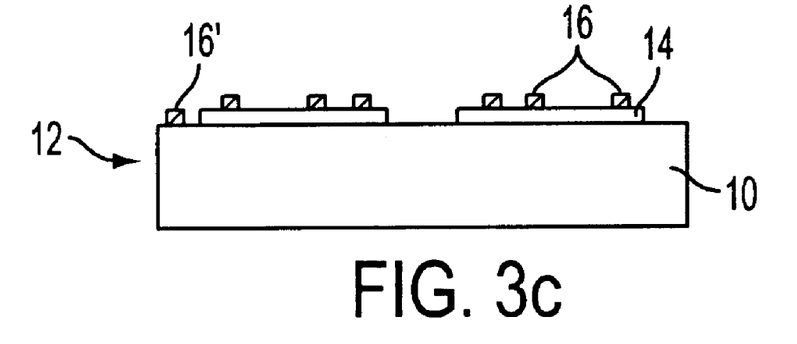
FIG. 3c is a cross-sectional side view of the illustrative nanowire device of FIG. 3b after the device has been heated sufficiently to cause the catalyst layer of FIG. 3b to gather into clumps of catalyst to form various catalyst sites on the surface of the device in accordance with the invention.

A catalyst patterning approach based on a metal migration technique is illustrated in FIGS. 3a, 3b, and 3c. Initially, device 12 may be processed to provide one or more patterned electrode pads 14, as shown in FIG. 3a. A thin layer of metal catalyst 22 may then be deposited on substrate 10 and device 12 as shown in FIG. 3b. The catalyst metal may, for example, be nickel for catalyzing growth of carbon nanotubes or may be gold for catalyzing growth of semiconductor nanowires. These are merely illustrative examples. Any suitable metal film may be deposited if desired.

The catalyst layer 22 of FIG. 3b may be on the order of 10 nm thick (e.g., in the range of 5–25 nm). As shown in FIG. 3c, heat may be applied to device 10 to induce the metal of layer 22 to migrate about the surface of device 12. For example, the temperature of device 12 may be raised to a temperature of 700 C or a temperature in the range of 500–1000 C or higher for a time in the range of a few minutes to a few hours. Because layer 22 is relatively thin, the inherent self attraction of the metal (i.e., its surface tension when made molten or softened by the heat) causes the layer 22 to form randomly-distributed clumps of metal. The metal clumps serve as catalyst sites 16. If layer 22 is deposited over the entire surface of device 12 (including the surfaces of pads 14 and the surface of substrate 10 without pads 14), some of the catalyst sites that are formed may be located on pads 14, as shown by sites 16 in FIG. 3c, and some of the catalyst sites may be located directly on substrate 10, as shown by site 16' in FIG. 3c. When pads 14 are used, the relative melting (softening) temperatures of the respective metals of pads 14 and sites 16 may be taken into consideration, so that the catalyst migrates at a temperature that is lower than the temperature at which the pads would be adversely affected.

The type of gaseous atmosphere in which device 12 is placed during the process of heating device 12 and substrate 10 to induce surface migration of the metal of layer 22 may affect the morphology of the resulting metal clumps (catalyst sites). Accordingly, device 12 may be heated in a gas environment that has been selected for its ability to produce a certain type of catalyst site morphology.

If it is desired to produce catalyst sites that have a three-dimensional beaded quality, devices 12 may be heated in a hydrogen-rich (reducing) environment. This type of atmosphere tends to passivate the oxides on metal pads 14 and on the other (coated or uncoated) portions of the surface of substrate 10. When the exposed surface of device 12 is passivated in this way, the metal tends to separate easily from the surface and is therefore more influenced by its own surface tension. As a result, the catalyst will generally form clumps that are beaded in appearance.

If it is desired to produce catalyst sites that have a flattened two-dimensional morphology, devices 12 may be heated in an oxygen-rich (oxidizing) environment. By supplying oxidizing gas to the surface of device 12 during heating, the surface tends to oxidize and become attractive to the metal when in its molten or softened state. The surface tension of the metal may not be able to overcome this inherent attraction. The metal therefore has the tendency to remain flattened against the surface, rather than forming beads of metal.

Factors such as the gasses used during heating, the amount of heating, and length of time for which heat is applied, the metal type, and the metal thickness all affect the size and distribution of the catalyst sites. In general, catalyst sites having lateral dimensions on the order of 10–100 nm (i.e., the lateral dimensions of the nanowires to be grown from the catalyst sites) may be produced.

Figure 4A:
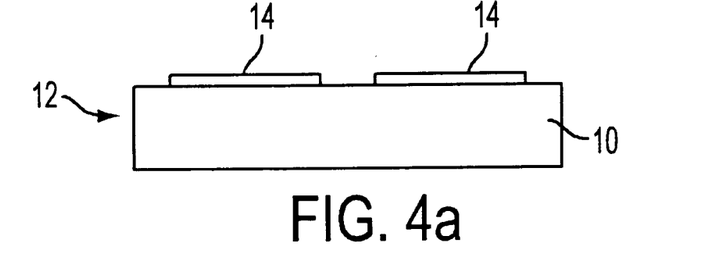
FIG. 4a is a cross-sectional side view of an illustrative nanowire device on which electrodes have been formed in accordance with the present invention.

A lithographic approach for forming catalyst sites 12 is shown in FIGS. 4a–4d. As shown in FIG. 4a, optional electrodes 14 may be patterned on the surface of substrate 10 in device 12 using any suitable technique (e.g., lithography).

Figure 4B:
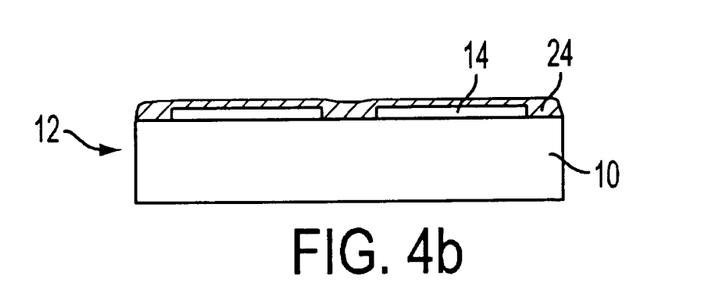
FIG. 4b is a cross-sectional side view of the device of FIG. 4a after resist has been applied in accordance with the present invention.

Resist 24 may then be applied, as shown in FIG. 4b. Any suitable resist may be applied. For example, if it is desired to pattern the resist using ultraviolet (UV) lithography, a UV-sensitive photoresist may be used. If it is desired to pattern the resist using e-beam lithography, an e-beam resist such as polymethylmethacrylate (PMMA) may be used. Other resists may be used when other types of lithography techniques are used to pattern the resist. Suitable types of lithography that may be used to pattern resist of device features include e-beam lithography, UV lithography, deep UV (DUV) lithography, extreme UV (EUV) lithography, ion beam lithography, laser-based techniques, and x-ray lithography.

As one illustrative example, deep UV lithography may be used to pattern resist 24. Deep UV lithography tools are available that are based on excimer laser light sources that operate at the excimer laser wavelengths of 193 nm and 248 nm. Phase-shift masks or other suitable masks may be used to ensure that high-quality features well under 200 nm in size are achievable when using these DUV wavelengths to expose the photoresist.

Figure 4C:
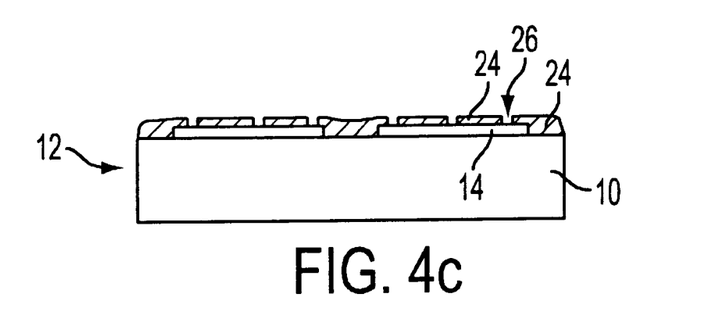
FIG. 4c is a cross-sectional side view of the device of FIG. 4b after the resist has been patterned in accordance with the present invention.

In the example of FIG. 4c, the resist layer 24 has been deposited before the catalyst. This is an appropriate technique when the catalyst is to be patterned using lift-off. If desired, however, the catalyst may be deposited before the resist and metal etching techniques used to pattern the catalyst.

As shown in FIG. 4c, after the resist has been exposed and (if needed) developed, the patterned resist may define one or more holes 26. The holes 26 may, for example, have lateral dimensions on the order of the desired size for the catalyst sites 16.

Figure 4D:
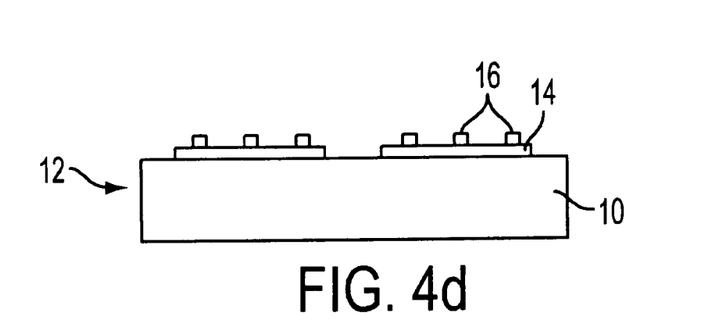
FIG. 4d is a cross-sectional side view of the device of FIG. 4c after catalyst has been deposited and the resist has been removed in accordance with the present invention.

The catalyst metal (e.g., nickel, gold, etc.) may be deposited (e.g., by evaporation) on top of resist 24. The catalyst metal may fill the bottom of the holes 26, but preferably does not significantly coat the sides of holes 26. As a result, the resist 24 and therefore the catalyst metal that lies on top of the resist may be removed by placing device 12 (e.g., the wafer of devices 12 that are being processed) into a resist solvent. Using this well-known lift-off technique, the resist and unneeded portions of the deposited catalyst metal may be removed, leaving the catalyst metal that was deposited at the bottom of holes 26, as shown in FIG. 4d. The metal at the bottom of holes 26 forms catalyst sites 16 of FIG. 4d.

Another suitable approach for patterning catalyst on device 12 involves using so-called soft lithography. With this approach a template is formed that absorbs catalyst in solution ("catalyst ink"). The catalyst ink may be deposited in a pattern by pressing the template against the upper surface of substrate 10.

Figure 5A:
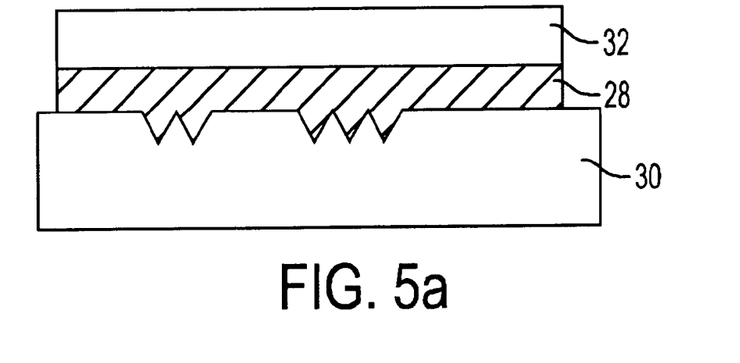
FIG. 5a is a cross-sectional side view of an illustrative soft lithography template in the process of being formed in accordance with the present.

A cross-sectional side view of an illustrative template 28 in the process of being formed is shown in FIG. 5a. In the example of FIG. 5a, template 28 is formed from a polymer or other suitable substance that may be molded against a template forming tool 30. The polymer from which template 28 is formed may be flexible, so a support structure 32 may be used to help support template 28. Initially, polymer layer 28 may be deposited on support 32. Polymer layer 28 preferably has good adhesion to support 32 and poor adhesion to template forming tool 30, so that after polymer layer 28 has been pressed between support 32 and tool 30 as shown in FIG. 5a, support 32 and template 28 may be removed from tool 30 without sticking to tool 30. The resulting template may have a pattern of raised features that match the desired pattern of catalyst sites that are to be formed on device 12.

Figure 5B:
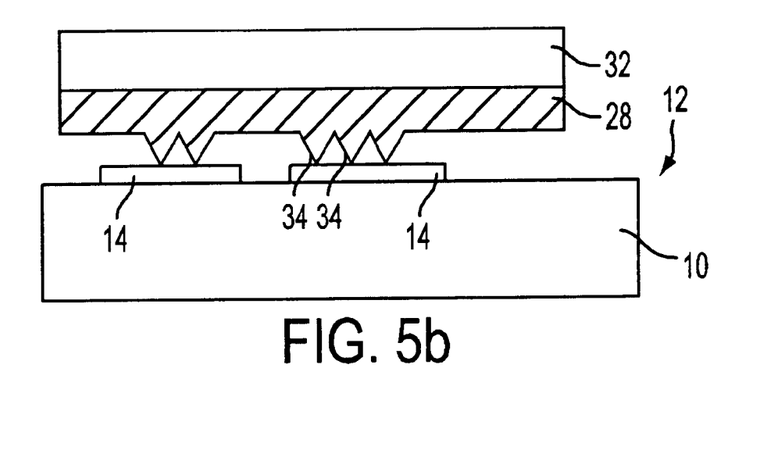
FIG. 5b is a cross-sectional side view showing how the soft lithography template of FIG. 5b may be used to deposit catalyst solution in a pattern on the surface of the nanowire device in accordance with the present invention.

After template 28 has been formed, template 28 may be impregnated with catalyst solution ("ink"). Once the catalyst solution has soaked into template 28, the template 28 and support 32 may be pressed against the upper surface of substrate 10 and device 12, as shown in FIG. 5b. In the example of FIG. 5b, device 12 has optional electrode pads 14. The tips 34 of template 34 contact device 12 at locations at which it is desired to form catalyst sites 16. The pressure between template tips 34 and device 12 causes template 28 to release a small quantity of the catalyst solution onto the surface of device 12 at the tip locations. (If desired, catalyst ink may be spread onto the surface or sprayed onto the surface of device 12 without using a template).

Figure 5C:
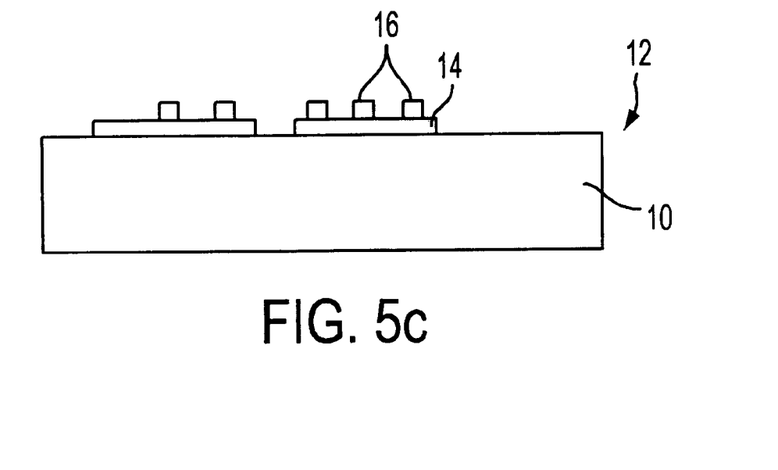
FIG. 5c is a cross-sectional side view of the illustrative nanowire device of FIG. 5b showing how the deposited catalyst solution forms a pattern of catalyst sites in accordance with the present invention.

The deposited catalyst solution may be air dried or may be dried using an oven, hot plate, or other suitable heating or drying arrangement. As shown in FIG. 5c, catalyst sites 16 are formed when the catalyst solution dries leaving catalyst behind.

Figure 6:
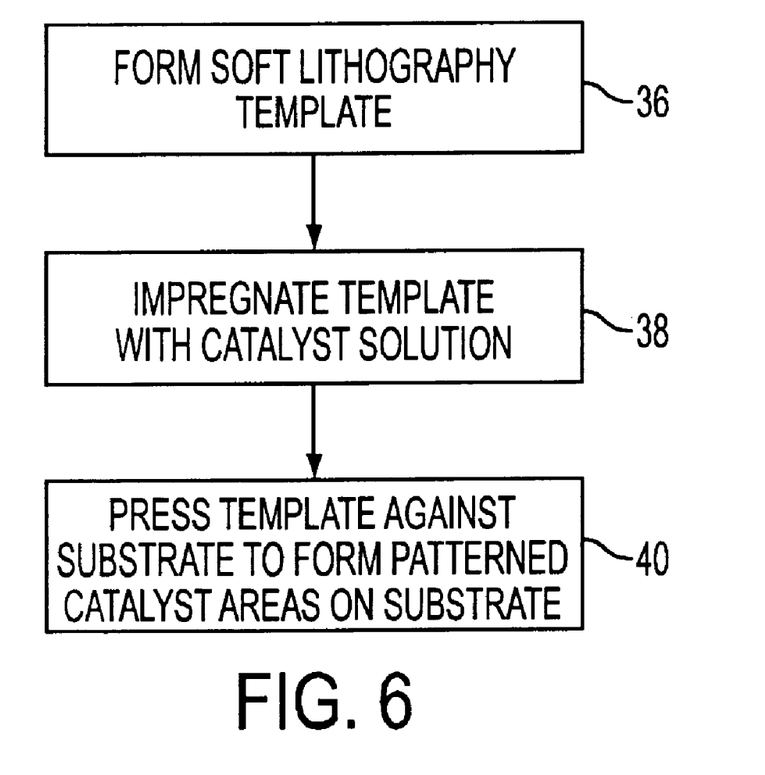
FIG. 6 is a flow chart of illustrative steps involved in forming patterned catalyst sites using the soft lithography approach of FIGS. 5a–5c in accordance with the present invention.

Illustrative steps involved in using soft lithography to form catalyst sites 16 are shown in FIG. 6. At step 36, the soft lithography template may be formed using a template forming tool of the type shown in FIG. 5a or other suitable techniques. The template has a pattern of raised features that matches the pattern of catalyst sites that are to be formed on the surface of device 12.

At step 38, the template 28 may be impregnated with catalyst. For example, a solution of catalyst (e.g., a liquid in which the catalyst is contained such as a colloid) may be applied to the template until the template absorbs the catalyst solution.

At step 40, the template may be placed into contact with the substrate 10 and device 12. For example, the template 28 may be pressed against the upper surface of device 12 as shown in FIG. 12. This causes the tips 34 of template 28 to release catalyst solution in the desired locations for the catalyst sites 16. The patterned catalyst solution that has been applied to the device in this way may be dried using a hot plate, oven, or other suitable arrangement, thereby forming suitable catalyst sites 16 prior to subsequent nanowire growth. When the catalyst solution dries it forms catalyst at the catalyst sites.

Figure 7:
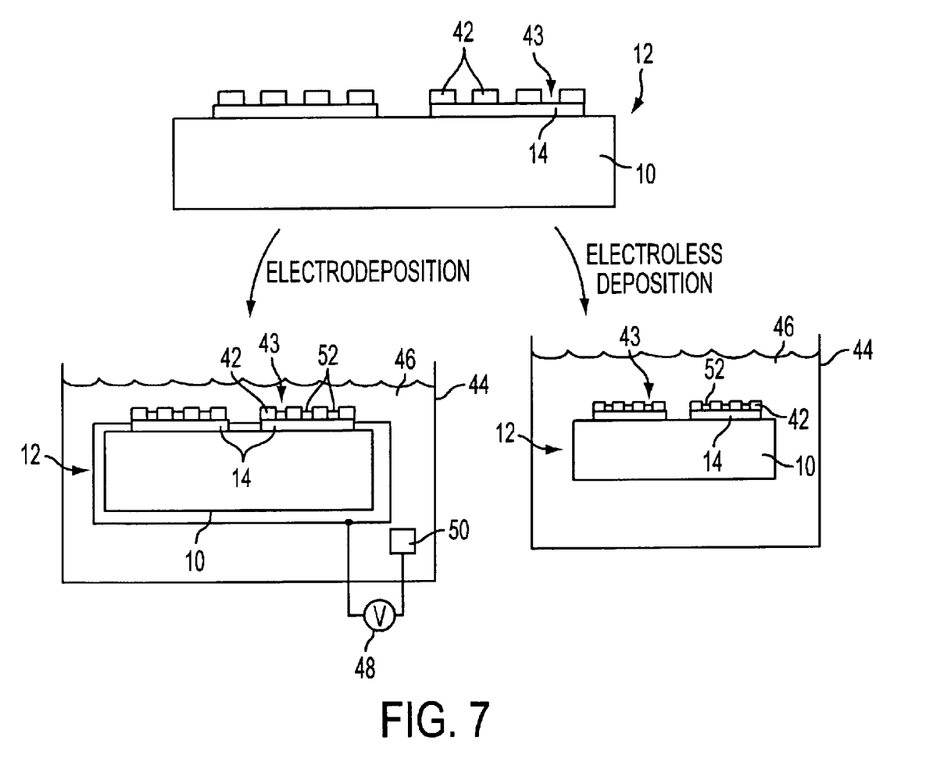
FIG. 7 is a schematic diagram illustrating how catalyst sites may be formed on a nanowire device using electrodeposition and electroless deposition techniques in accordance with the present invention.

Patterned catalyst sites may also be formed using electrochemical techniques, as shown in FIG. 7. As shown in the upper portion of FIG. 7, device 12 may have optional electrode pads 14 patterned on substrate 10. A masking material 42 may be applied in a desired pattern on the top surface of device 12 (e.g., on top of any pads 14 that are on device 12). The material 42 may be resist, oxide, nitride, or any other suitable material for use as a mask during electrochemical deposition. The material 42 may be patterned (e.g., by lithography or other suitable techniques) to define holes 43 where it is desired to deposit catalyst.

As shown in the lower left portion of FIG. 7, the device 12 with the patterned material 42 may be immersed in a vessel 44 containing an electrolyte 46 (an electrochemical solution containing catalyst). Electric current may be applied to device 12 using a voltage or current source 48. Source 48 may be connected between an electrode 50 that is immersed in solution 46 and device 12. The connection to device 12 may be made, e.g., via a backside contact to the substrate 10 or may be made using electrodes that are in direct electrical contact with surface pads 14 (as shown in FIG. 7). When current is applied to device 12, catalyst deposition is induced in holes 43 through the process of electrodeposition. The resulting catalyst metal 52 forms catalyst sites 16 in a pattern matching the pattern of material 43. Following electrodeposition, material 43 may be removed from device 12 (e.g., using a solvent).

As shown in the lower right portion of FIG. 7, catalyst may also be deposited using an electroless deposition process. With this approach, the catalyst metal 52 is deposited in holes 43 through an electrochemical reaction between catalyst solution 46 and the underlying metal of pad 14 or other material at the bottom of holes 43. Once the metal 52 has been deposited to form the desired pattern of catalyst sites 16, the material 43 may be removed if desired. With electroless deposition it is not necessary to apply a current to device 12 during the deposition process.

Figure 8A:
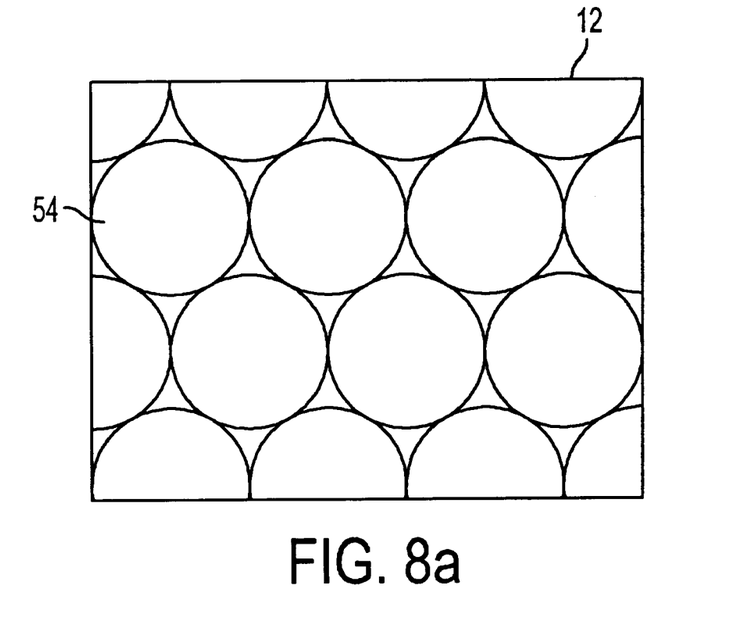
FIG. 8a is a plan view of a nanowire device onto which microscopic spheres have been placed to serve as a mask during catalyst deposition in accordance with the present invention.
Figure 8B:
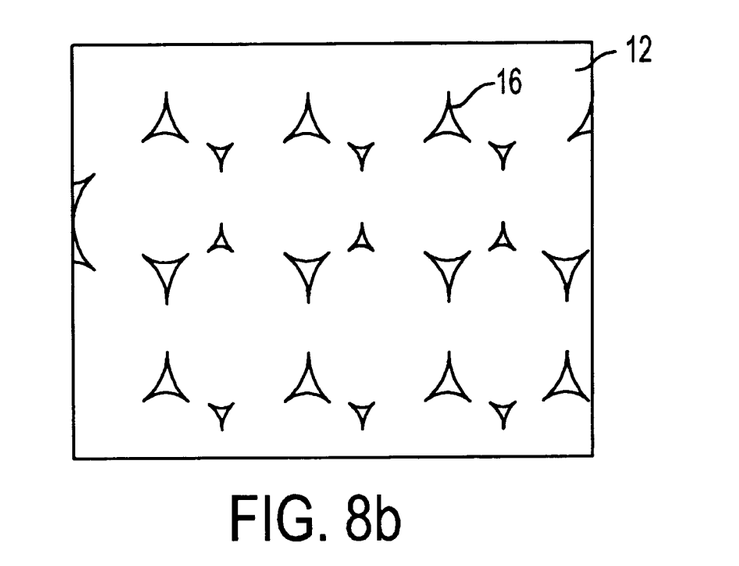
FIG. 8b is a plan view of the device of FIG. 8a following catalyst deposition showing how the spheres of FIG. 8a may act as a mask for forming patterned catalyst sites in accordance with the present invention.

An approach for forming patterned catalyst sites 16 using a mask of microscopic spheres is shown in FIGS. 8a and 8b. As shown in the plan view of FIG. 8a, spheres 54 may be applied to device 12 in a single-layer or nearly single-layer film. When catalyst (e.g., nickel or gold) is deposited on top of spheres 54 of FIG. 8a (e.g., using evaporation), the spheres 54 act as a mask, blocking the catalyst from reaching the surface of device 12 and forming the pattern of catalyst sites 16 shown in FIG. 8b.

Figure 9:
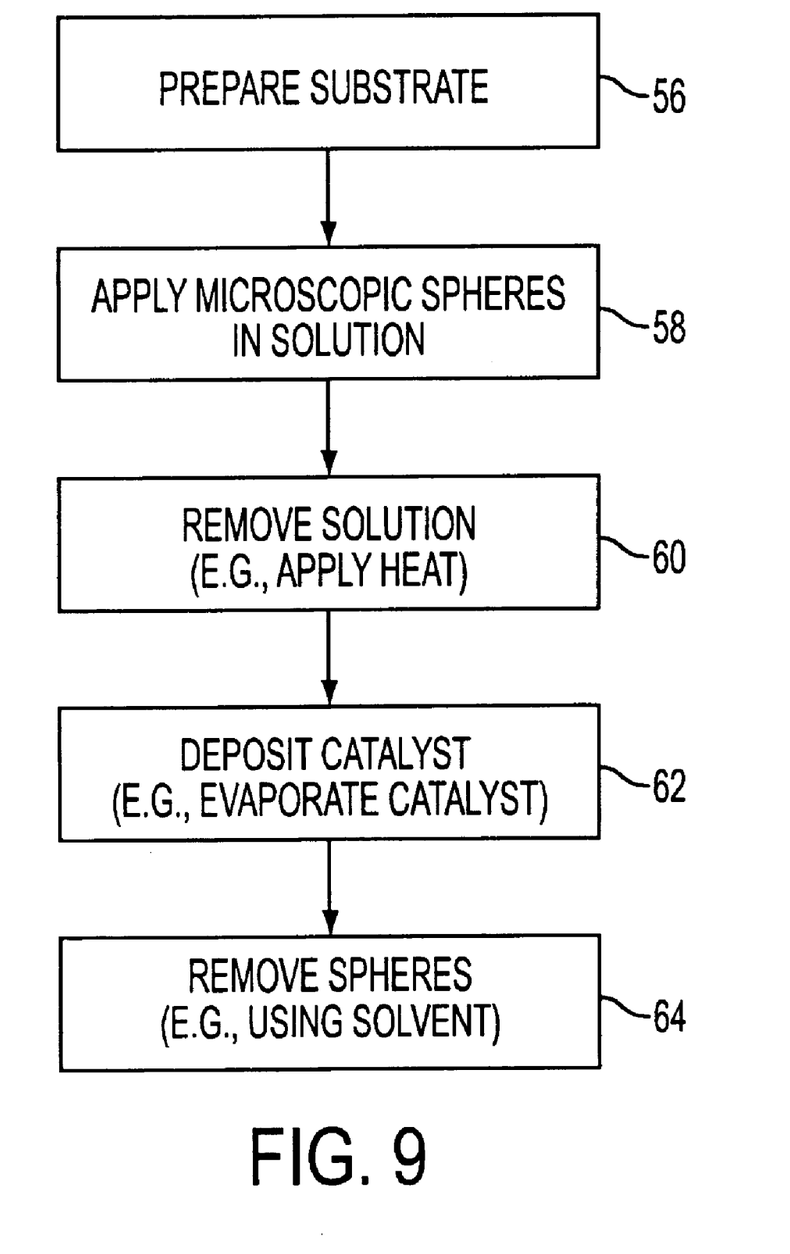
FIG. 9 is a flow chart of illustrative steps involved in patterning catalyst onto nanowire devices using the approach illustrated in FIGS. 8a and 8b in accordance with the present invention.

Illustrative steps involved in using microscopic spheres to form a masking layer of the type used in FIGS. 8a and 8b are shown in FIG. 9. At step 56, the substrate 10 and device 12 may be prepared. For example, any desired (optional) electrode pads 14 may be patterned on the surface of device 12.

At step 58, microscopic spheres 54 may be applied to the surface of device 12. For example, a solution of microscopic spheres may be applied to the surface of a wafer containing multiple devices using spraying, the spin-on technique, or any other suitable technique. The spheres 54 may be formed from any suitable material such as oxides, silicon dioxide, polystyrene, PMMA, metal, ceramics, polymers, etc. Spheres 54 may have diameters in the range of 100 nm to 10 $\mu$m or more. These are merely illustrative dimensions. Spheres with any suitable dimensions for forming desired catalyst site patterns may be used.

At step 60, the liquid (solution) with which the spheres were applied to the surface of device 12 may be removed by, for example, applying heat to device 12 using a hot plate, vacuum oven, oven, or other suitable equipment.

Spheres 54 are preferably applied to the surface of device 12 in a single layer, so that catalyst can be deposited to the surface of device 12 through the interstitial areas or regions formed by adjoining spheres. Catalyst (e.g., nickel or gold) may be deposited using evaporation, sputtering, or any other suitable deposition technique at step 62. The spheres 54 block the catalyst except in the interstitial locations, so that a catalyst pattern of the type shown in FIG. 8b is formed on device 12.

Following catalyst deposition, spheres 54 may be removed from the surface of device 12 (e.g., using a solvent), leaving the catalyst sites 16 for use in growing nanowires.

Figure 10A:
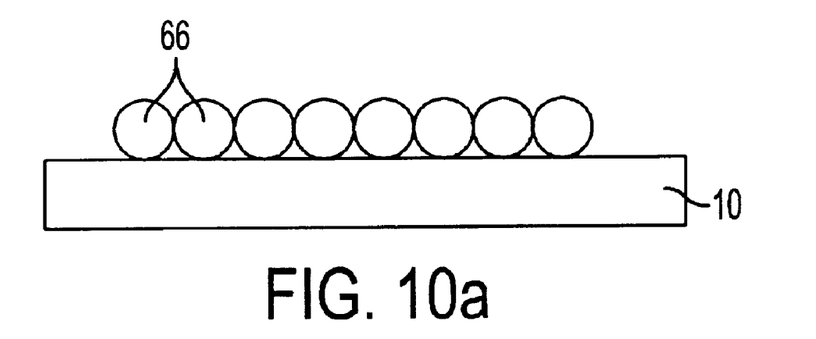
FIG. 10a is a cross-sectional side view of an illustrative nanowire device substrate to which a film of collapsible microspheres impregnated with catalyst in the form of catalyst compounds has been applied in accordance with the present invention.
Figure 10B:
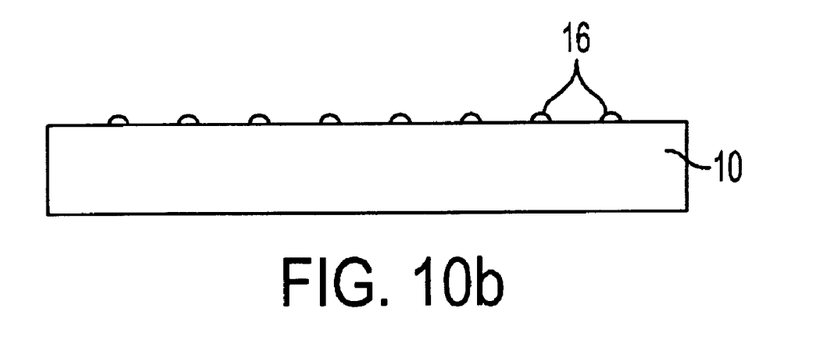
FIG. 10b is a cross-sectional side view of the illustrative nanowire device of FIG. 10a after the catalyst has been released from the microspheres and deposited in a pattern of catalyst sites on the substrate surface in accordance with the present invention.

Catalyst may be patterned on substrate 10 using collapsible catalyst microcapsules or microscopic spheres (microspheres) 66, as shown in FIGS. 10a and 10b. Microspheres 66 may be formed from polystyrene or other suitable materials. The diameter of microspheres 66 may be selected based on the desired spacing between adjacent catalyst sites 16 (FIG. 10b). In general, the diameter may be in the range of 100 nm to 10 μm. As an example, the microspheres may have a diameter of about 5 μm or 3–10 μm. The microcapsules are preferably porous (e.g., 40% porous), so that they may be filled with metal salts (i.e., metal compounds such as $FeCl_3$ in the case of an iron catalyst).

The microspheres 66 may be transformed into catalyst sites 16 as shown in FIG. 10b, by applying heat and an appropriate atmosphere to the microspheres. In this process, the polystyrene or other microsphere material is consumed and the metal salts transform into suitable catalyst materials such as metal oxide catalyst deposits. The deposits form in the same location where the microspheres were located, thereby forming an evenly distributed pattern of catalyst sites 16, as shown in FIG. 10b.

Figure 11:
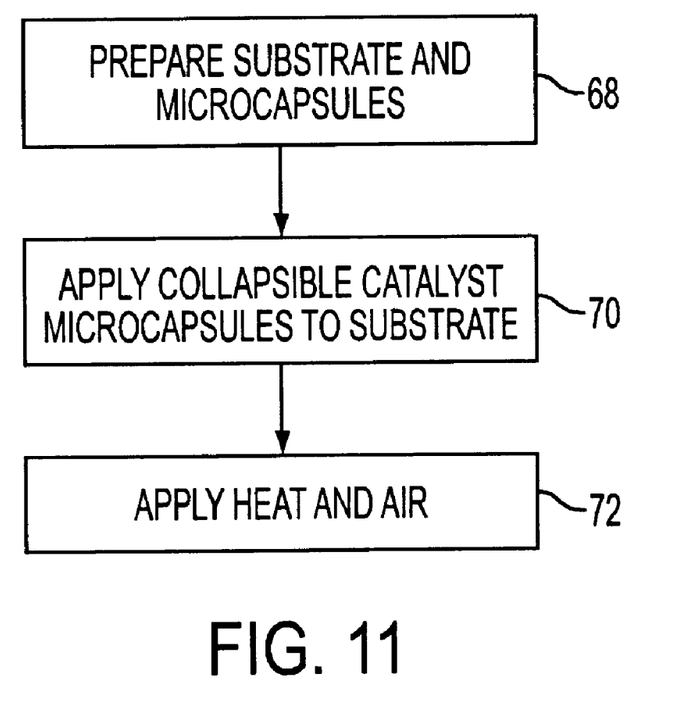
FIG. 11 is a flow chart of illustrative steps involved in using the microsphere catalyst patterning approach of FIGS. 10a and 10b to form catalyst sites in accordance with the present invention.

Illustrative steps involved in forming catalyst sites 16 from collapsible microspheres are shown in FIG. 11. At step 68, substrate 10 may be prepared. For example, optional electrode pads 14 may be provided on device 12 using any suitable deposition and patterning techniques.

At step 70, the microspheres 66 may be applied to the substrate 10 and device 12. The microspheres may be provided in the form of a liquid that is sprayed onto substrate 10 (e.g., while substrate 10 is in the form of a wafer), that is applied to substrate 10 using the spin-on technique, or that is applied to the surface of substrate 10 using any other suitable technique. To avoid the situation in which catalyst sites 16 merge into each other excessively, the thickness of the film containing the microspheres and the concentration of the microspheres are preferably not too great. This ensures sufficient separation of the catalyst sites 16 from each other.

At step 72, the microspheres may be heated so that they are collapsed (e.g., by burning or oxidizing). Any suitable environment may be used to induce transformation of the microspheres 66 into catalyst sites 16. The microspheres may, for example, be heated to a temperature of 400 C for 72 hours in an atmosphere of air. (Other temperatures such as temperatures in the range of 300–500 C and other times such as times from 48–96 hours may be used). The size of catalyst sites 16 may be controlled by adjusting the amount of catalyst that is used to fill the porous structure of the spheres. As with the other catalyst patterning arrangements described above, nanowires can be grown from the catalyst sites.

With the microsphere masking approach of FIGS. 8a, 8b, and 9 and with the porous microsphere approach of FIGS. 10a, 10b, and 11, the spheres or capsules need not be perfectly round and different shapes (e.g., cubes, irregular solids, etc.) may be used for the capsules in place of spheres. Moreover, the capsules need not be uniform in diameter or lateral dimension. A narrow distribution or a wide distribution of different dimensions may be used, so long as the resulting catalyst pattern is acceptable for the desired application of the nanowire device 12.

After one of the above catalyst patterning techniques has been used to from a desired pattern of catalyst sites 16 on device 12, nanowires (e.g., single-wall carbon nanotubes, multiple-wall carbon nanotubes, or semiconductor nanowires) may be grown from the catalyst sites (e.g., using thermal CVD or plasma CVD). Additional processing steps such as material deposition and patterning steps may then be performed if desired to further adapt devices 12 for use in desired applications such as sensor equipment applications, field emitter applications for displays, etc. Device 12 may also be planarized (e.g., using a chemical-mechanical polishing technique).

The devices 12 that have been formed on a substrate 10 may be separated (e.g., by dicing a wafer into individual die or individual portions of substrate). Various packaging techniques may be used. For example, device 12 may be wire-bonded or connected with solder balls to a ceramic carrier, lead-frame, dual-inline package, or other suitable mount or housing. Circuitry on other integrated or discreet circuits may be interconnected with device 12. Hermetic sealing may be used to protect portions of device 12 from the environment. After any desired post processing steps such as these are performed, device 12 may be installed in a system (e.g., in a sensor instrument or in a display, etc.)

It will be understood that the foregoing is only illustrative of the principles of the invention and that various modifications can be made by those skilled in the art without departing from the scope and spirit of the invention. Many examples of such modifications have been given through the foregoing specification.

The Invention claimed is:

1. A method for forming a plurality of catalyst sites from which to grow nanowires for a nanowire device that has a substrate with an upper surface, the method comprising:

depositing a layer of catalyst on the upper surface of the substrate; and heating the substrate and catalyst sufficiently to cause the catalyst to migrate along the surface of the substrate to form individual clumps of catalyst, wherein the clumps serve as the catalyst sites for nanowire growth.

2. The method defined in claim 1 wherein the catalyst is a metal selected from the group consisting of gold and nickel.

3. The method defined in claim 1 further comprising heating the substrate and catalyst in a reducing environment.

4. The method defined in claim 1 further comprising heating the substrate and catalyst in an oxidizing environment.

5. A method for forming a plurality of catalyst sites from which to grow nanowires for a nanowire device that has a substrate with an upper surface, the method comprising:

applying a layer of resist to the substrate;

using deep UV lithography to pattern the resist to form a plurality of holes in the resist at desired locations on the upper surface of the substrate;

depositing a layer of catalyst on the patterned resist; and removing the resist after the catalyst has been deposited to leave catalyst at the catalyst sites.

6. The method defined in claim 5 wherein using deep UV lithography comprises using excimer lasers and phase shift masks to form the plurality of holes.

7. The method defined in claim 5 wherein the catalyst comprises a metal and wherein the method further comprises growing nanowires from the catalyst sites.

8. The method defined in claim 5 wherein the catalyst comprises a metal and wherein the method further comprises growing nanowires from the catalyst sites, the method further comprising depositing a layer of insulator on top of the nanowires and planarizing the deposited insulator so that tips of the nanowires are exposed.

9. A method for forming a plurality of catalyst sites in a desired pattern from which to grow nanowires for a nanowire device that ha s a substrate with an upper surface, the method comprising:

impregnating a template having a pattern of raised features that match the desired pattern of the catalyst sites with a catalyst solution; and placing the template against the upper surface to release catalyst solution onto the upper substrate surface in the desired pattern, wherein the catalyst solution forms catalyst at the catalyst sites when dry.

10. The method defined in claim 9 wherein the catalyst includes a metal.

11. A method for forming a plurality of catalyst sites from which to grow nanowires for a nanowire device that has a substrate with an upper surface, the method comprising:

applying a layer of material to the substrate that has a plurality of holes, wherein the holes define desired locations for the catalyst sites;

immersing the substrate in a liquid containing catalyst; and forming the catalyst sites for nanowire growth by depositing catalyst metal in the holes from the liquid.

12. The method defined in claim 11 wherein forming the catalyst sites further comprises depositing catalyst metal by electrodeposition.

13. A method for forming a plurality of catalyst sites from which to grow nanowires for a nanowire device that has a substrate with an upper surface, the method comprising:

applying a layer of microscopic spheres to the upper surface;

depositing a layer of catalyst on top of the microscopic spheres, so that catalyst is deposited on the upper surface in interstitial regions defined by the microscopic spheres; and removing the microscopic spheres from the upper surface after the catalyst has been deposited so that catalyst remains on the upper surface at the catalyst sites.

14. The method defined in claim 13 wherein applying the layer of microscopic spheres to the upper surface comprises:

applying a liquid containing the microscopic spheres to the upper surface; and heating the substrate to remove the liquid and leave the microscopic spheres.

15. The method defined in claim 13 wherein the microscopic spheres have diameters in the range of 3 to 10 microns.

16. A method for forming a plurality of catalyst sites from which to grow nanowires for a nanowire device that has a substrate with an upper surface, the method comprising:

applying a layer of microscopic porous spheres filled with catalyst to the upper surface;

applying heat to the microscopic porous spheres to transform the microscopic porous spheres into the catalyst sites.

17. The method defined in claim 16 wherein the catalyst in the porous spheres is provided in the form of a metal salt.

18. The method defined in claim 16 wherein applying heat to the microscopic porous spheres comprises heating the microscopic porous spheres to a temperature in the range of 300–500 C for at least 48 hours in an air atmosphere.

* * * * *